United States Patent [19]

LePage

[11] Patent Number: 5,202,623

[45] Date of Patent: Apr. 13, 1993

[54] LASER-ACTIVATED PLASMA CHAMBER FOR NON-CONTACT TESTING

[75] Inventor: Andrew J. LePage, Hampstead, N.H.

[73] Assignee: Digital Equipment Corporation, Maynard, Mass.

[21] Appl. No.: 842,043

[22] Filed: Feb. 26, 1992

[51] Int. Cl.⁵ ............................................. G01R 31/02
[52] U.S. Cl. .................................. 324/158 F; 324/73.1; 324/501; 324/537
[58] Field of Search ................... 324/158 F, 538, 537, 324/500, 501, 459, 158 R, 73.1, 158 P

[56] References Cited

U.S. PATENT DOCUMENTS

| | | | |
|---|---|---|---|
| 4,507,605 | 3/1985 | Geisel | 324/537 |
| 4,705,329 | 11/1987 | Doemens | 324/459 |
| 4,771,230 | 9/1988 | Zeh | 324/459 |
| 4,891,578 | 1/1990 | Doemens | 324/158 F |
| 4,970,461 | 11/1990 | LePage | 324/158 R |
| 5,017,863 | 5/1991 | Mellitz | 324/73.1 |
| 5,032,788 | 7/1991 | Ringleb et al. | 324/158 R |

Primary Examiner—Ernest F. Karlsen
Attorney, Agent, or Firm—Arnold, White & Durkee

[57] ABSTRACT

A non-contact testing device for detecting continuity or shorts in conductors of a printed circuit board or integrated circuit employs a laser-activated plasma to make electrical connection between a test probe and a node under test. The plasma is generated in air in a small chamber which is subjected to a concentrated laser pulse, and the plasma exits the chamber due to its self-generated pressure. An electrically-conductive plume of ionized gas (i.e., plasma) is thus used to probe a circuit without making physical contact by a probe. Preferably, the chamber is a conical shape with metallic walls, and the laser pulse is directed into the chamber by a fiber optic cable ending at the large end of the chamber. The plasma exits an orifice at the small end of the conical chamber. The device may be moved about by an X-Y positioning mechanism to probe the circuit under test.

16 Claims, 1 Drawing Sheet

LASER-ACTIVATED PLASMA CHAMBER FOR NON-CONTACT TESTING

BACKGROUND OF THE INVENTION

This invention relates to electrical testing equipment and methods, and more particularly to a method for non-contact testing of small electrical conductors as on printing circuit boards or integrated circuit devices.

The purpose of this device is to produce an electrically-conductive plume of ionized gas (i.e., a plasma) that can be used to probe a circuit without actually coming into physical contact with the circuit. This device is intended for use in electrical tests such as simple open/-shorts testing of electrical circuits in an engineering or manufacturing environment.

Methods previously used for performing electrical tests on circuit boards and the like have often employed some kind of physical contact, such as by a probe physically moved by an X-Y mechanism, or a so-called bed-of-nails. As the size of features on the electrical device have decreased, the likelihood of damage as a result of testing has greatly increased to the point where traditional probing methods simply cannot be used on some devices.

To circumvent the problem of physical damage by an electrical probe, several methods of no-contact testing have been developed. On method previously investigated was the use of an electrically-conductive, laser-induced plasma. For example, in my U.S. Pat. No. 4,970,461 for a "Method and Apparatus for Non-Contact Testing of Electrical Circuits," there is disclosed testing equipment where a laser is directed to selected spot on a circuit board held in a gas-filled chamber, with an electric field produced in the area of the target. A charge is built up on a node of the circuit board due to laser-induced discharge across the field, and when the field is reversed, a visible plasma is created as the charged node of the circuit is discharged. Continuity can thus be visually checked by observing which conductors are glowing.

Another method of non-contact testing using a laser to charge nodes on a circuit board is disclosed in U.S. Pat. No. 5,017,863, issued to Richard I. Mellitz, assigned to Digital Equipment Corporation. A scanned laser beam impinges on a photoemissive grid mounted close to the board under test, and electrons are emitted from the grid. A field between the grid and the board causes electrons to be attracted to the conductors of the board, and the amount of charge transferred can be measured to determine the amount of charge needed for a given node, giving an indication of opens or shorts.

Other methods of non-contact testing have used a scanned electron beam. These methods are particularly well adapted for scanning semiconductor integrated circuit devices, but require an evacuated chamber to hold the entire assembly and are complex and expensive, as well as being unwieldy in a production environment for large devices such as printed circuit boards.

A major drawback of prior methods of non-contact testing has been the inability to reliably test features smaller than about 25-mils. In order to decrease the size of the plasma, a prior attempt has made use of a plasma "torch" implemented by a small ceramic chamber in which a high voltage electrical discharge caused the formation of the plasma. Two permanent magnets on the chamber would interact with the residual sheath current in the plasma to electromagnetically force the plasma through a small orifice in the chamber. This orifice would shape and confine the size of this plasma. Unfortunately, the plasma produced by this "torch" is very noisy electrically, and so is of little use.

SUMMARY OF THE INVENTION

In accordance with one embodiment of the invention, a method of non-contact testing for detecting continuity or shorts in conductors of a printed circuit board or integrated circuit employs a laser-activated plasma to make electrical connection between a test probe and a node under test. The plasma is generated in air in a small chamber which is subjected to a concentrated laser pulse, and the plasma exits the chamber due to its self-generated pressure. An electrically-conductive plume of ionized gas (i.e., plasma) is thus used to probe a circuit without making physical contact by a probe. Preferably, the chamber is a conical shape with metallic walls, and the laser pulse is directed into the chamber by a fiber optic cable ending at the large end of the chamber. The plasma exits an orifice at the small end of the conical chamber. The device may be moved about by an X-Y positioning mechanism to probe the circuit under test.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
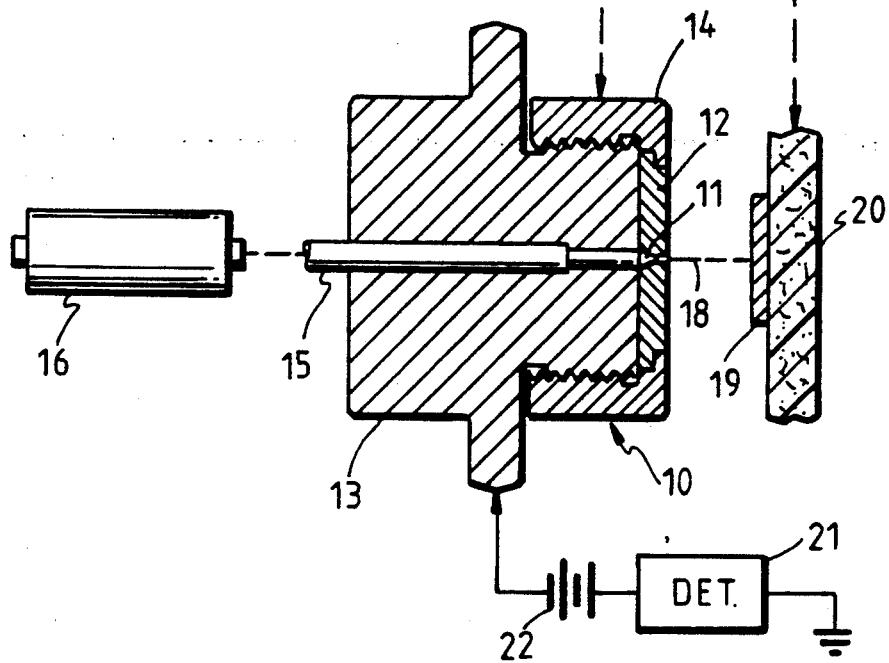
FIG. 1 is a diagram of electrical test equipment using a laser-induced plasma, according to one embodiment of the invention.

Referring to FIG. 1, a laser plasma nozzle 10 according to one embodiment of the invention comprises a small, conically-shaped chamber 11 having conductive metallic walls defined in a metal disk 12. The disk 12, composed of aluminum or the like, is held in place on a metallic support or fitting 13 by a screw-threaded ring 14 engaging the fitting 12. The fitting 13 has a central axial bore of about 1-mm diameter into which a fiber optic cable 15 is inserted. The fiber optic element leads to a laser device 16. As seen in the enlarged view of FIG. 2, the chamber 11 has an orifice 17 with a diameter of about five mils at the small end of the cone shape, and it is through this orifice that the plasma jet 18 escapes to impinge upon a conductor 19 on a circuit board 20 under test.

Figure 2:
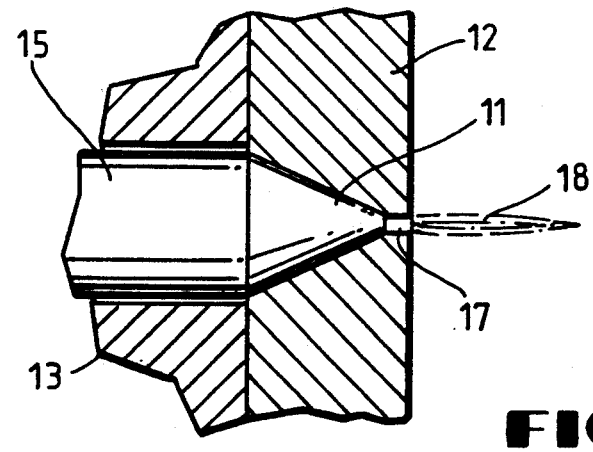
FIG. 2 is an enlarged sectional view of the plasma chamber seen in FIG. 1.
Figure 2:
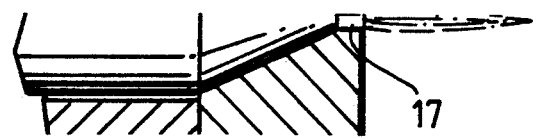

The laser device 16 in the example embodiment is a pulsed Nd:YAG laser of the type commercially available, operating at a wavelength of 1064 nm, having a pulse length of about nine nanoseconds and a pulse energy of at least 15-milliJoules. Other fast pulse lasers operating at different wavelengths can also be used. The fiber optic element 15 conducts the laser pulse to the chamber, and the flat end of the cable 15 in effect forms on wall of the chamber 11. Alternatively, a thin transparent plate can cover the wide end of the conical chamber, if no fiber optic cable is used. In the preferred embodiment, the conical shape of the chamber with its metallic walls function to concentrate the pulsed laser energy in a central area of the chamber, as seen in FIG. 2. To enhance performance, perhaps a lens or other optical element could be used to focus the laser beam in the center of the chamber.

The small metallic chamber 11 has a volume of less than a cubic millimeter. One side of the chamber, opposite the orifice 12 is sealed by the end of the fiber optic cable 15, so this in effect provides an optically transparent window to allow a laser pulse to enter. To produce the plasma jet 18, the laser 16 device is fired by an electrical pulse, and the resultant pulse of laser light is directed into the small chamber 11 via the fiber optic cable 15 so that the light intensity in the chamber reaches at least 200-million watts per square centimeter (for the laser specified above). Through the process of laser-induced multiphoton photoionization, with the metallic walls of the chamber 11 acting as a source of seed electrons, the air inside the chamber ionizes and turns into a conductive plasma. In this embodiment, the chamber is filled with ambient air, but other gasses could be used, as well. As the plasma expands, it is forced out of the chamber through the small orifice 17 producing a small tongue 18 of conductive plasma. The conductor 19 of the circuit to be probed is placed such that this plasma jet 18 will touch it. For the lifetime of the plasma (which, depending on system parameters, can be anywhere from a few to hundreds of microseconds), the conductor 19 and the metallic interior wall of the chamber 11 are electrically connected; in other embodiments, the chamber and laser source can be constructed to produce a continuous plasma instead of a pulse. By connecting the chamber (via the fitting 13) to the appropriate instrumentation, e.g., a detector 21, electrical measurements of the circuit can be made without making physical contact with the conductor 19 of the circuit board 20. For example, the detector 21 may be merely an oscilloscope, on which the pulse of current or lack thereof can be observed, or it may consist of threshold-responsive circuitry triggered by the pulse of current conducted by the plasma in the circuit made up of the fitting 13, the chamber 11, the plasma jet 18 and the conductor 19, along with a voltage source 22. The amount of charge needed to charge up a particular node will be dependent upon the size and capacity of the node, which in turn is dependent upon whether opens or shorts exist, compared to the designed configuration of the circuit.

The laser-induced probe 10 of FIG. 1 is positioned with respect to the circuit board 20 to bring the plasma 18 to impinge upon a particular conductor 19 by an X-Y positioning mechanism 23. The mechanism 23 may move the probe while the board under test stays stationary, or vice versa. Alternatively, the probe may be moved by hand, but care must be exercised to avoid physical contact between probe 10 and conductor 19. As the probe 10 is moved to apply the pulse to the conductors in a particular pattern, the resultant conductive paths detected by the detector 21 may be compared with a standard representing the pattern of conductors for a board of the same construction known to be good.

This device has several advantages. First, it allows circuits to be electrically probed without making physical contact, thus minimizing probe-induced damage to the circuit being tested. Second, unlike previous methods that use a laser induced plasma for probing, this device produces the plasma inside of a small chamber 11 and uses the chamber's orifice 17 to control the size and shape of the plasma jet 18. Last, because this device uses a laser 16 to produce the plasma, it is electrically quiet, unlike previous plasma "torches" whose electrical noise problems rendered them useless for electrical test applications.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. Apparatus for testing an electrical part having a plurality of conductive paths thereon, comprising:
   a) means for directing a laser pulse to impinge upon gaseous contents of a small chamber having conductive walls to generate in said chamber a plasma;
   b) said chamber having a small orifice to allow said plasma to exit by expansion of the plasma;
   c) means for positioning said chamber to direct said plasma from said orifice toward a conductor of a part under test;
   d) detector means responsive to the amount of conduction via said plasma between said conductive walls and said conductor.

2. Apparatus according to claim 1 wherein said gaseous content is air.

3. Apparatus according to claim 1 wherein said chamber has a transparent side for admitting said laser pulse.

4. Apparatus according to claim 3 wherein said laser pulse is focused on a central area of the interior of said chamber through said window.

5. Apparatus according to claim 1 wherein said means for positioning includes an X-Y positioner.

6. Apparatus according to claim 1 including a fiber optic element for conducting said laser pulse into said chamber.

7. Apparatus according to claim 1 wherein said chamber is conically shaped and said orifice is at the small end of said conical shape.

8. Apparatus according to claim 7 including a fiber optic element extending to the large end of said conical shape for directing said laser pulse input said chamber.

9. Apparatus according to claim 8 wherein said fiber optic element is of about the same diameter as a large end of said conical shape.

10. A method of testing a device having a plurality of conductive paths thereon, comprising the steps of:
    a) directing a laser pulse to impinge upon the gaseous contents of a small chamber having conductive walls to generate a plasma in said chamber;
    b) allowing said plasma to exit said chamber via a small orifice, by expansion of the plasma;
    c) positioning said chamber to direct said plasma from said orifice toward one of said conductive paths of a device under test;
    d) detecting the amount of conduction via said plasma from said conductive walls to said conductive path.

11. A method according to claim 10 wherein said chamber is of conical shape and said orifice is at a small end of said conical shape.

12. A method according to claim 10 wherein said step of directing is by a fiber optic element.

13. A method according to claim 12 wherein said content of said chamber is air.

14. A method according to claim 13 wherein said chamber is of conical shape and said orifice is at a small end of said conical shape, said fiber optic element being of about the same size as a large end of said conical shape.

15. A method according to claim 14 including the step of positioning said device under test with respect to said orifice by an X-Y positioning mechanism.

16. A method according to claim 10 including the step of comparing said detected amount of conduction with a reference pattern of charge transfer for said device under test.

* * * * *